(12) United States Patent
Bopp et al.

(10) Patent No.: US 8,701,953 B2
(45) Date of Patent: Apr. 22, 2014

(54) ELECTRONIC FLIGHT BAG MOUNTING SYSTEM

(75) Inventors: Jayson K. Bopp, Fishers, IN (US); Sarah L. Palmer, New Palestine, IN (US)

(73) Assignee: Raytheon Company, Waltham, MA (US)

( * ) Notice: Subject to any disclaimer, the term of this patent is extended or adjusted under 35 U.S.C. 154(b) by 1082 days.

(21) Appl. No.: 12/576,780

(22) Filed: Oct. 9, 2009

(65) Prior Publication Data
US 2011/0084106 A1  Apr. 14, 2011

(51) Int. Cl.
| B60R 9/00 | (2006.01) |
| B60R 11/00 | (2006.01) |
| A47F 5/00 | (2006.01) |
| E04G 3/00 | (2006.01) |
| A47H 1/10 | (2006.01) |

(52) U.S. Cl.
USPC ... 224/547; 224/553; 248/289.11; 248/282.1; 248/299.1

(58) Field of Classification Search
USPC .......... 224/553, 563, 547, 548, 483; 248/289.11, 290.1, 282.1, 299.1, 248/292.14, 288.31, 922
See application file for complete search history.

(56) References Cited

U.S. PATENT DOCUMENTS

| 3,138,994 | A | * | 6/1964 | Blunk | 89/37.01 |
| 4,185,801 | A | * | 1/1980 | Plymoth | 248/282.1 |
| 4,836,485 | A | * | 6/1989 | Cooper | 248/278.1 |
| 4,923,154 | A | * | 5/1990 | Konkel | 248/131 |
| 5,222,690 | A | | 6/1993 | Jeffords | |
| 5,529,271 | A | * | 6/1996 | Dunchock | 248/205.2 |
| 5,626,320 | A | | 5/1997 | Burrell | |
| 5,787,167 | A | * | 7/1998 | Anderson | 379/446 |
| 5,806,355 | A | * | 9/1998 | Lanigan et al. | 70/257 |
| 6,113,046 | A | | 9/2000 | Wang | |
| 6,394,403 | B1 | | 5/2002 | Hung | |
| 6,517,040 | B1 | | 2/2003 | Wen | |
| 6,588,719 | B1 | * | 7/2003 | Tubach | 248/282.1 |
| 6,915,757 | B2 | * | 7/2005 | Urban et al. | 116/173 |
| 6,931,368 | B1 | | 8/2005 | Seifert | |
| 7,490,796 | B2 | * | 2/2009 | Kim | 248/157 |
| D595,723 | S | | 7/2009 | Bures et al. | |
| 7,686,250 | B2 | * | 3/2010 | Fortes et al. | 244/129.1 |
| 7,737,867 | B2 | | 6/2010 | Arthur et al. | |

(Continued)

FOREIGN PATENT DOCUMENTS

EP   1 120 597 A1   8/2001   ............. F16M 11/06

OTHER PUBLICATIONS

PCT Notification of Transmittal of the International Search Report and the Written Opinion of the International Searching Authority, or the Declaration; International application No. PCT/US2010/046750; 12 pages; Nov. 16, 2010.

*Primary Examiner* — Justin Larson
*Assistant Examiner* — Lester L Vanterpool
(74) *Attorney, Agent, or Firm* — Renner, Otto, Boisselle & Sklar, LLP

(57) ABSTRACT

According to one embodiment, an electronic flight bag mounting system a cockpit mounting member coupled to an electronic flight bag mounting member. The cockpit mounting member is configured to mount to a cockpit of an aircraft, while the electronic flight bag mounting member is configured to be coupled to an electronic flight bag. The electronic flight bag mounting member is movable from a deployed position in which a display of the electronic flight bag faces a cockpit seat configured in the cockpit to a storage position in which the electronic flight bag faces away from the cockpit seat.

21 Claims, 8 Drawing Sheets

(56) References Cited

U.S. PATENT DOCUMENTS

| | | |
|---|---|---|
| 8,308,114 B2 * | 11/2012 | DeBuhr et al. ............ 248/188.1 |
| 2004/0006412 A1 | 1/2004 | Doose et al. |
| 2006/0066459 A1 | 3/2006 | Burch et al. |
| 2007/0075202 A1 * | 4/2007 | Gordon ................... 248/289.11 |
| 2007/0223186 A1 | 9/2007 | Wang |
| 2009/0153343 A1 | 6/2009 | Shafaat et al. |
| 2010/0072323 A1 | 3/2010 | Groomes et al. |
| 2010/0152923 A1 | 6/2010 | Aspen et al. |

* cited by examiner

ELECTRONIC FLIGHT BAG MOUNTING SYSTEM

GOVERNMENT RIGHTS

This invention was made with government support under government contract number N00019-05-G-0008, MV-22 Netted Weather Trade Study. The Government may have certain rights in this invention.

TECHNICAL FIELD OF THE DISCLOSURE

This disclosure generally relates to electronic flight bags, and more particularly, to an electronic flight bag mounting system and a method of using the same.

BACKGROUND OF THE DISCLOSURE

The operation of aircraft often entails numerous management operations to ensure its safe operation during flight. Management operations may include pre-flight check procedures to verify operational integrity of the aircraft, generation of flight plans detailing specific routes to be taken, and/or take off or landing calculations based upon the capability of the aircraft and its intended payload.

Historically, management operations related to the operation of aircraft have been conducted using paper-based forms and logbooks in which entries were hand-written prior to and following the flight. With the advent of modern computing systems, however, devices commonly referred to as electronic flight bags (EFBs) have been developed to alleviate hand-written entries and pre-flight calculations performed manually. Electronic flight bags are generally computing devices configured to perform functions associated with operation of aircraft. In many cases, electronic flight bags are configured in relatively small tablet sized housings and have touch screens for entry of information from which flight logs may be maintained and pre-flight calculations performed automatically.

SUMMARY OF THE DISCLOSURE

According to one embodiment, an electronic flight bag mounting system includes a cockpit mounting member coupled to an electronic flight bag mounting member. The cockpit mounting member is configured to mount to a cockpit of an aircraft, while the electronic flight bag mounting member is configured to be coupled to an electronic flight bag. The electronic flight bag mounting member is movable from a deployed position in which a display of the electronic flight bag faces a cockpit seat configured in the cockpit to a storage position in which the electronic flight bag faces away from the cockpit seat.

Some embodiments of the disclosure may provide numerous technical advantages. For example, one embodiment of the electronic flight bag mounting system may maintain the electronic flight bag in an easily viewed location in the cockpit of an aircraft, and provides for its movement to a storage position that may reduce obstruction of the pilot's view when not in use. Cockpits of aircraft are often configured with many instruments and control mechanisms that may be positioned in the cockpit to provide relatively good view for the pilot while operating the aircraft. In many cases, the placement of these instruments and control mechanisms may affect the ability of the pilot to react in a timely manner to changing conditions of the aircraft and other external elements affecting operation of the aircraft. The electronic flight bag mounting system according to the teachings of the present disclosure provides a relatively high level of situational awareness for the pilot by allowing a good ergonomic view of the electronic flight bag when needed, and providing a storage position for the electronic flight bag that does not unduly obstruct his or her view when not needed.

Some embodiments may benefit from some, none, or all of these advantages. Other technical advantages may be readily ascertained by one of ordinary skill in the art.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

It should be understood at the outset that, although example implementations of embodiments are illustrated below, various embodiments may be implemented using any number of techniques, whether currently known or not. The present disclosure should in no way be limited to the example implementations, drawings, and techniques illustrated below. Additionally, the drawings are not necessarily drawn to scale.

Electronic flight bags (EFBs) are computing devices that perform functionality associated with operation of an aircraft. For example, electronic flight bags may include navigational charts to aid its user with the development of flight plans. These electronic flight bags may also include various tools for calculating other operational parameters of the aircraft's flight including the minimum amount of fuel needed, takeoff speed, and/or specific routes to be taken.

Electronic flight bags are often housed in relatively small tablet-sized housings that may be easily carried by pilots of aircraft and may include touch screens for entry of information. In many cases, electronic flight bags may include functionality that is useful to pilots during flight. For example, an electronic flight bag may include a real-time GPS navigational map indicating the instantaneous position of the aircraft. It would therefore, be beneficial to easy view of electronic flight bags during flight. To provide this functionality, some electronic flight bags have been configured with mounting systems for securement to the leg of the pilot using straps. This mounting system, however, is often cumbersome and uncomfortable when used on long flights.

Figure 1A:
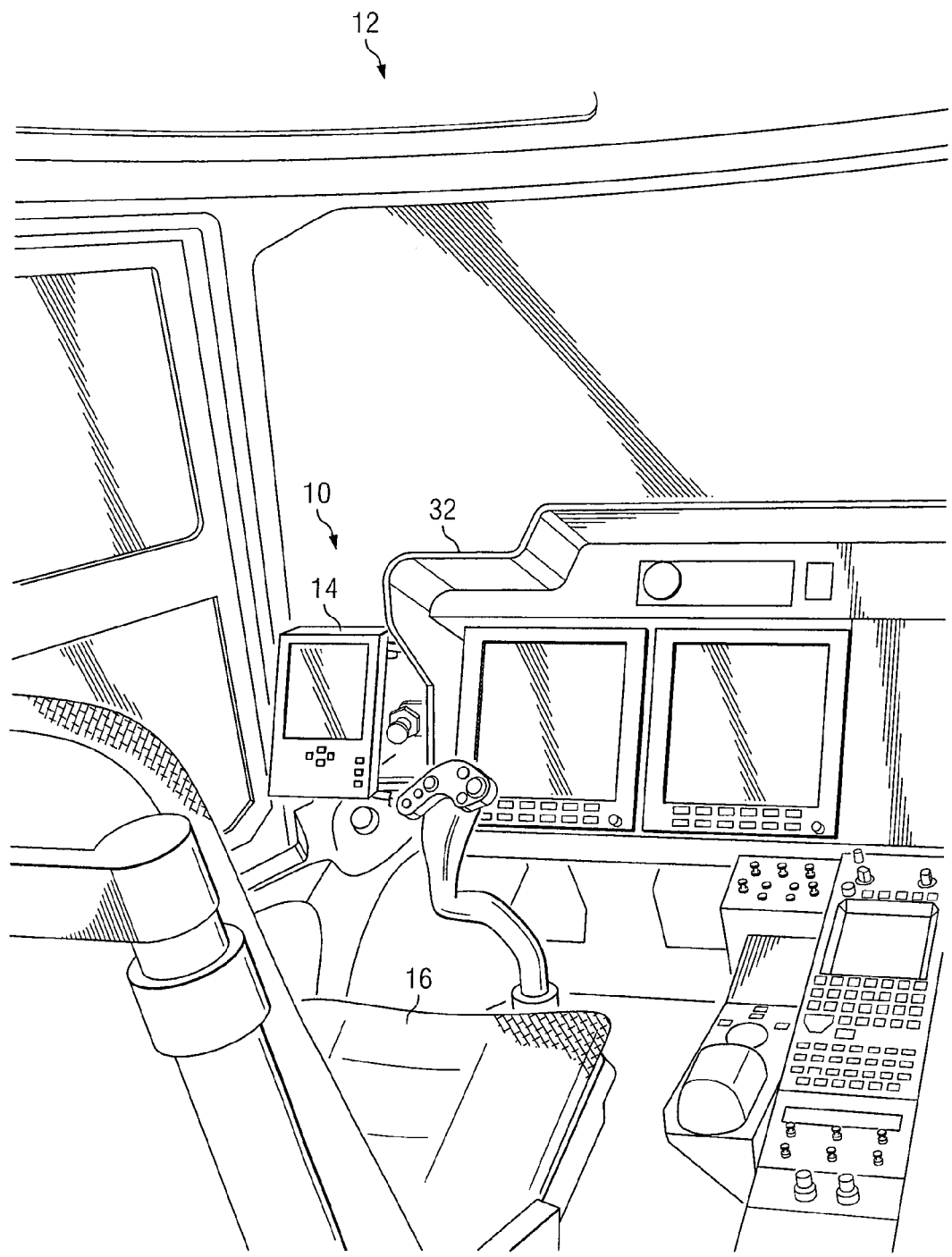
FIGS. 1A, 1B, and 1C are front perspective, enlarged front perspective, and enlarged rear perspective views, respectively, of one embodiment of an electronic flight bag mounting system according to the teachings of the present disclosure.
Figure 1B:
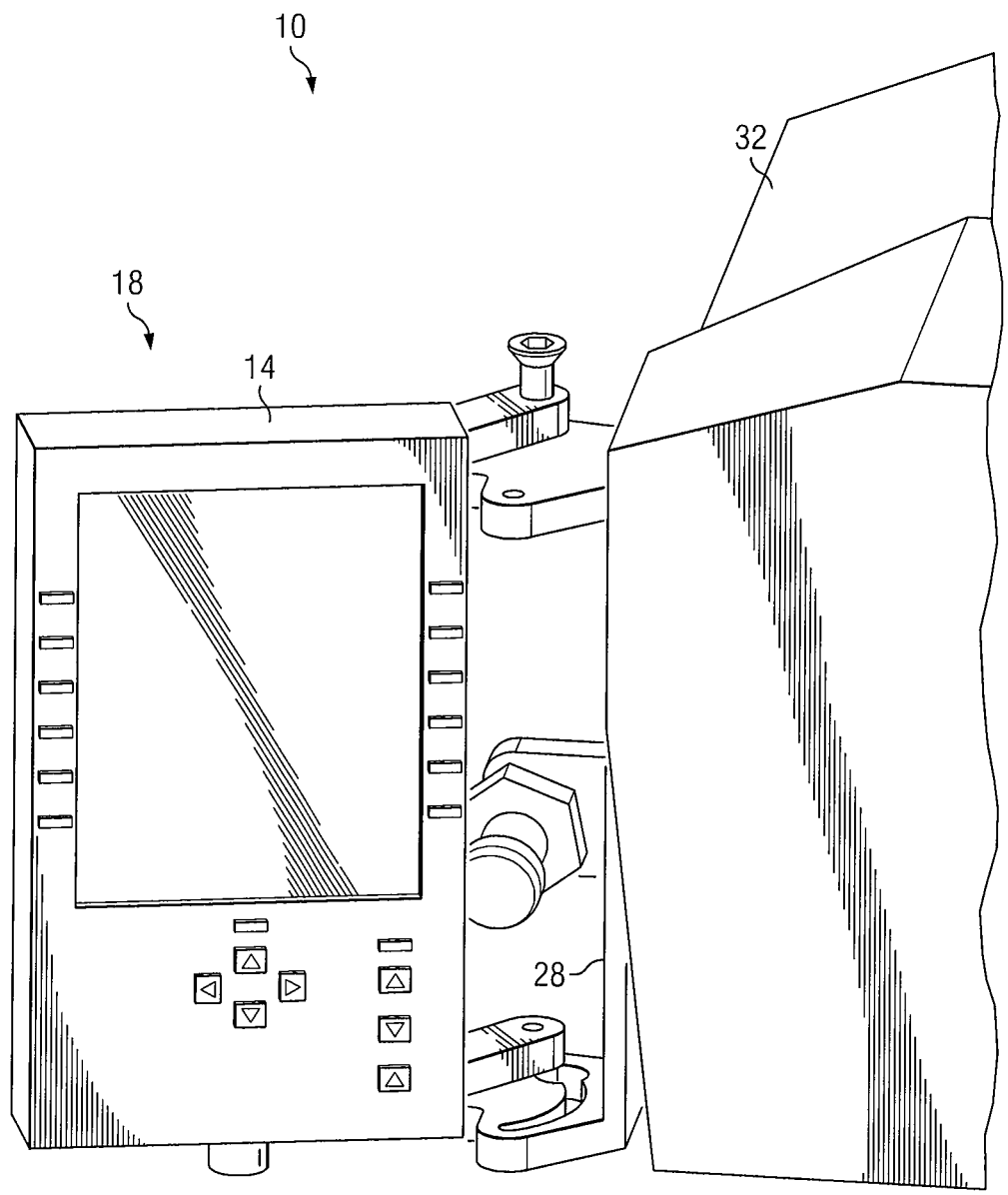
Figure 1C:
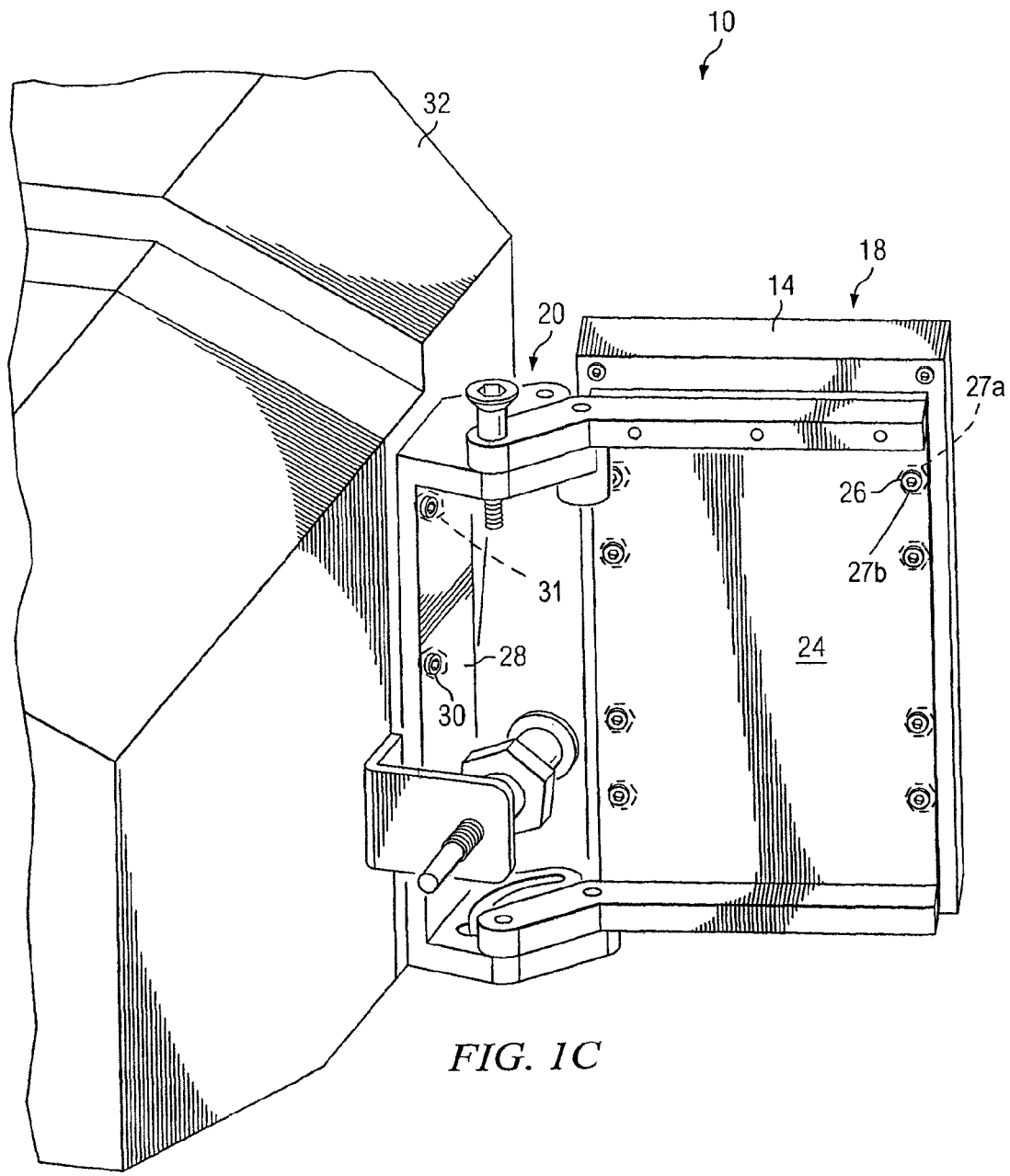
Figure 3A:
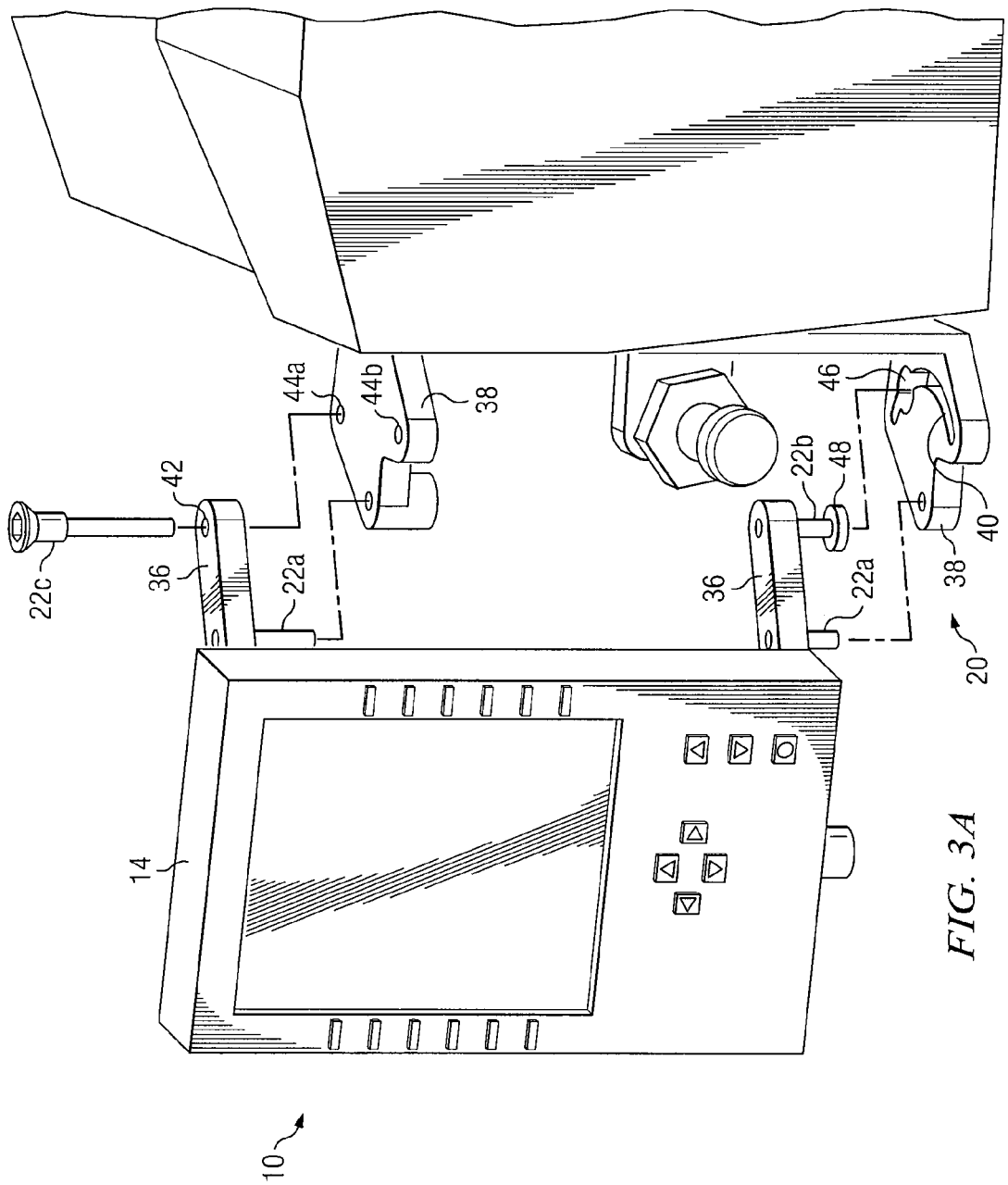
FIGS. 3A and 3B are enlarged front perspective and enlarged rear perspective views of the electronic flight bag mounting system of FIG. 1A in a removed position in which the electronic flight bag mounting member is decoupled from the cockpit mounting member.
Figure 3B:
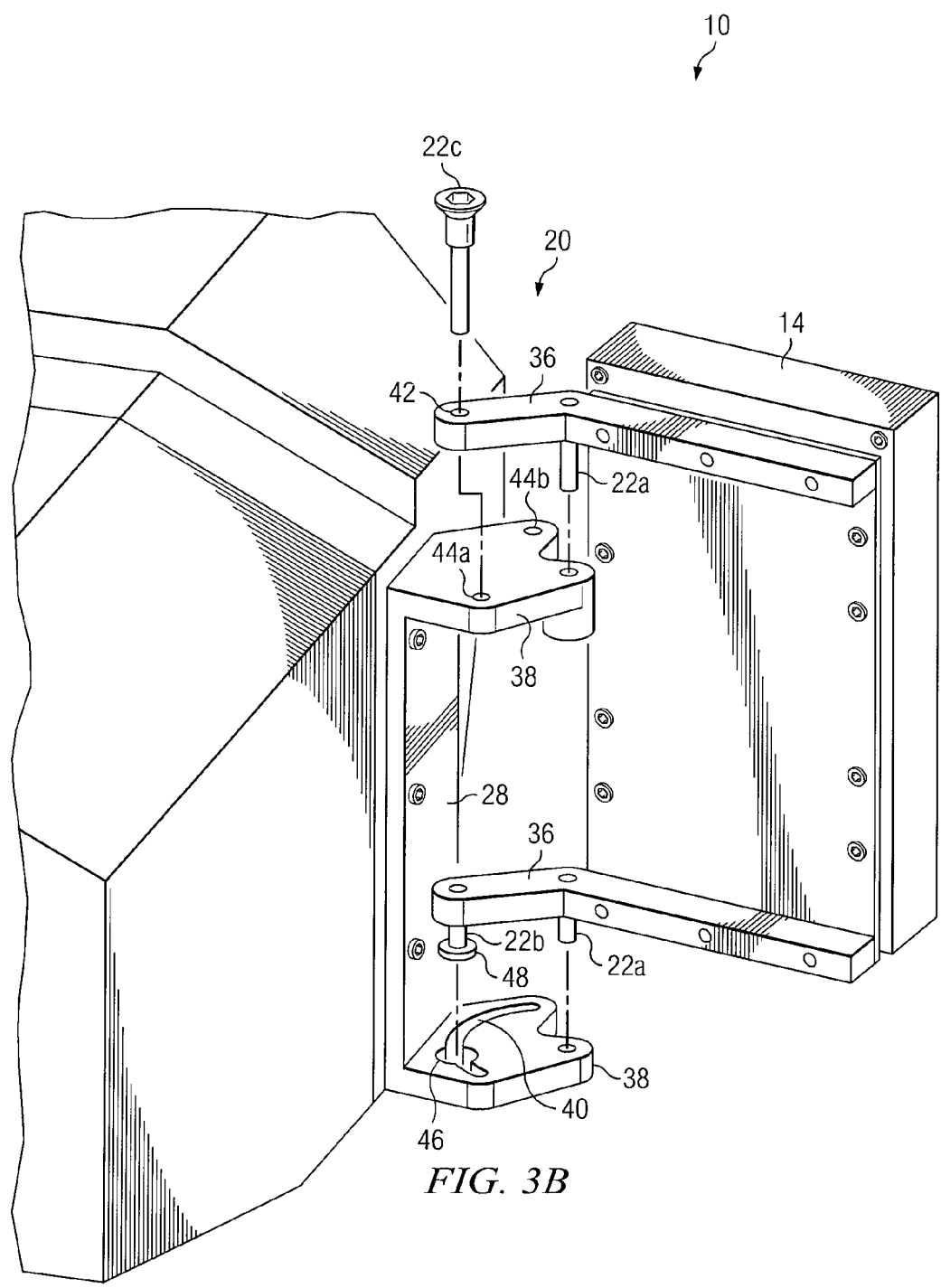

FIGS. 1A, 1B, and 1C are front perspective, enlarged front perspective, and enlarged rear perspective views, respectively, of one embodiment of an electronic flight bag mounting system 10 according to the teachings of the present disclosure. As shown, electronic flight bag mounting system 10 is implemented in a cockpit 12 of an aircraft to provide hands free operation and view of an electronic flight bag 14 by a pilot sitting in a cockpit seat 16 of the aircraft. Electronic flight bag mounting system 10 includes a bracket assembly with an electronic flight bag mounting member 18 and a cockpit mounting member 20 coupled together through one or more pins 22 (FIGS. 3A and 3B). Electronic flight bag mounting member 18 secures electronic flight bag 14 to electronic flight bag mounting system 10 while cockpit mounting member 20 secures electronic flight bag mounting system 10 to cockpit 12.

Electronic flight bag mounting system 10 may be mounted to electronic flight bag 14 in any suitable manner. In the embodiment shown, electronic flight bag mounting member 18 includes a plate 24 that is configured with multiple holes 26. Holes 26 have a bolt pattern similar to multiple female studs 27a configured in electronic flight bag 14 such that bolts 27b may be used to secure electronic flight bag 14 to plate 24. In other embodiments, any suitable mounting mechanism may be used to mount electronic flight bag 14. For example, electronic flight bag mounting member 18 may include one or more straps that may extend around the periphery of electronic flight bag 14 and are held in place using hook and loop fastening material. As another example, electronic flight bag 14 may be mounted to electronic flight bag mounting member 18 using spring loaded clasps that are dimensioned to grip the outer edges of electronic flight bag 14. As another example, electronic flight bag mounting member 18 may be integrally formed with the housing of electronic flight bag 14 such that it is permanently attached to electronic flight bag 14.

In the particular embodiment shown, cockpit mounting member 20 also includes a plate 28 configured with multiple holes 30 with a bolt pattern similar to multiple female studs 31 configured in cockpit 12. In other embodiments, cockpit mounting member 20 may be secured to cockpit 12 using other mounting mechanisms as described above with respect to electronic flight bag mounting member 18. In one embodiment, the hole pattern of cockpit mounting member 20 may be similar to a preexisting bolt pattern configured in the cockpit 12. For example, an aircraft such as a Bell-Boeing V-22 Osprey may be configured with multiple female studs configured in the side of a console 32 of cockpit 12. Thus, the bolt pattern of cockpit mounting member 20 may be configured with a similar bolt pattern to facilitate mounting of electronic flight bag mounting system 10 on the console of a Bell-Boeing V-22 Osprey.

Electronic flight bag mounting system 10 may be mounted to any component of the cockpit 12 of an aircraft. As shown, electronic flight bag mounting system 10 is mounted to the side of console 32 of cockpit 12. In other embodiments, electronic flight bag mounting system 10 may be mounted to other components of cockpit 12, such as the pilot's seat 16, on top of console 32, underneath console 32, or other suitable location in the cockpit 12 of an aircraft.

Figure 2A:
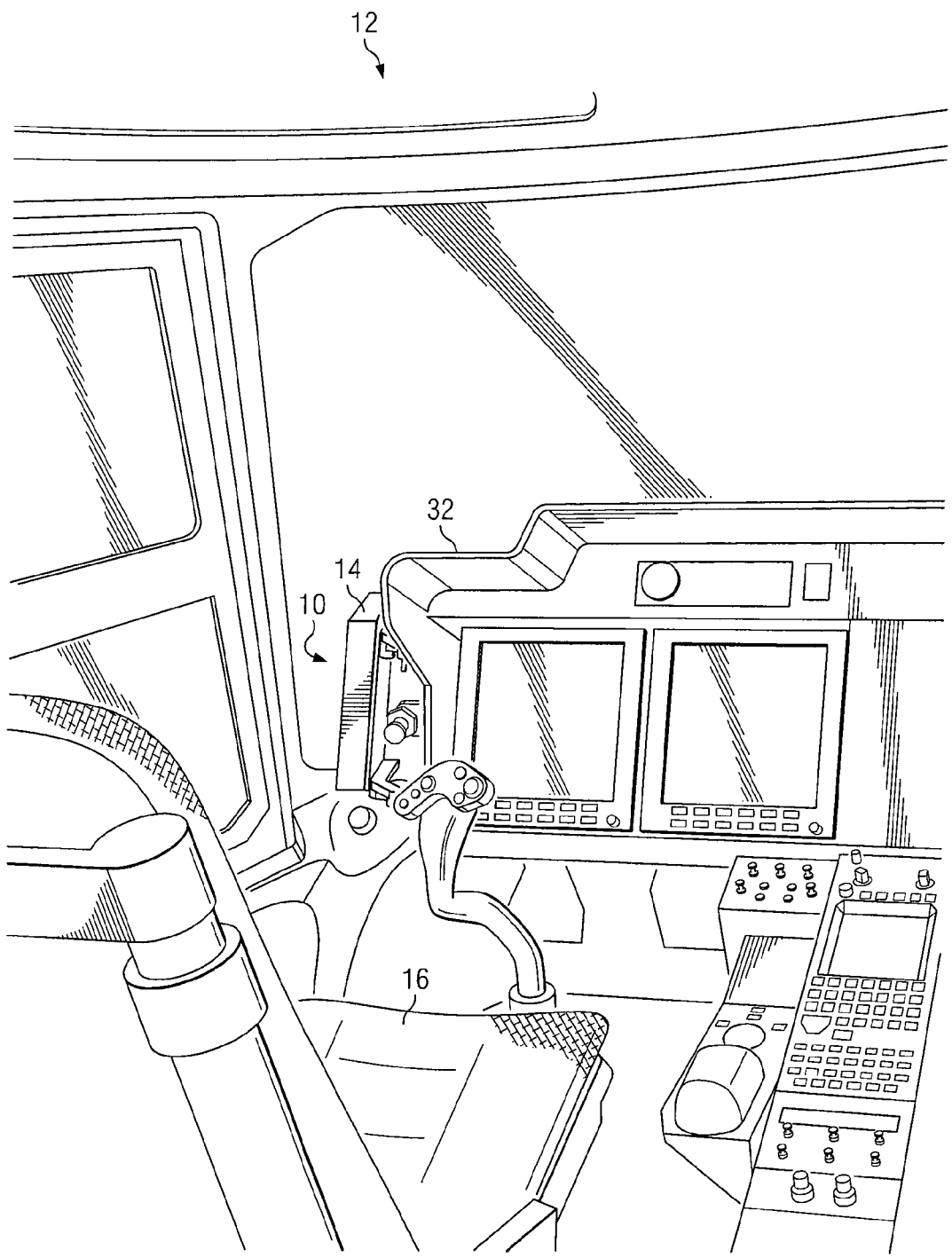
FIGS. 2A, 2B, and 2C are front perspective, enlarged front perspective, and enlarged rear perspective views, respectively, of the electronic flight bag mounting system while in a storage position.
Figure 2B:
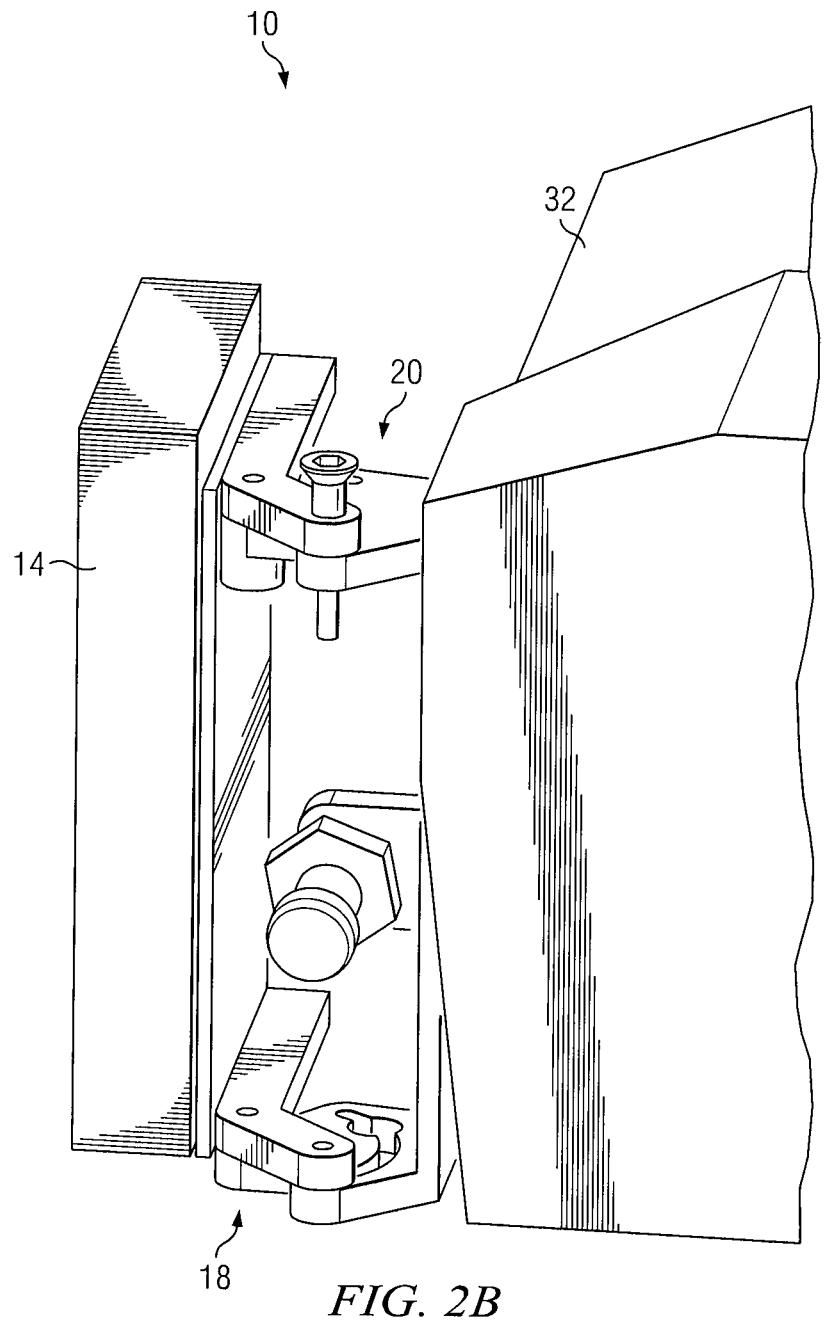
Figure 2C:
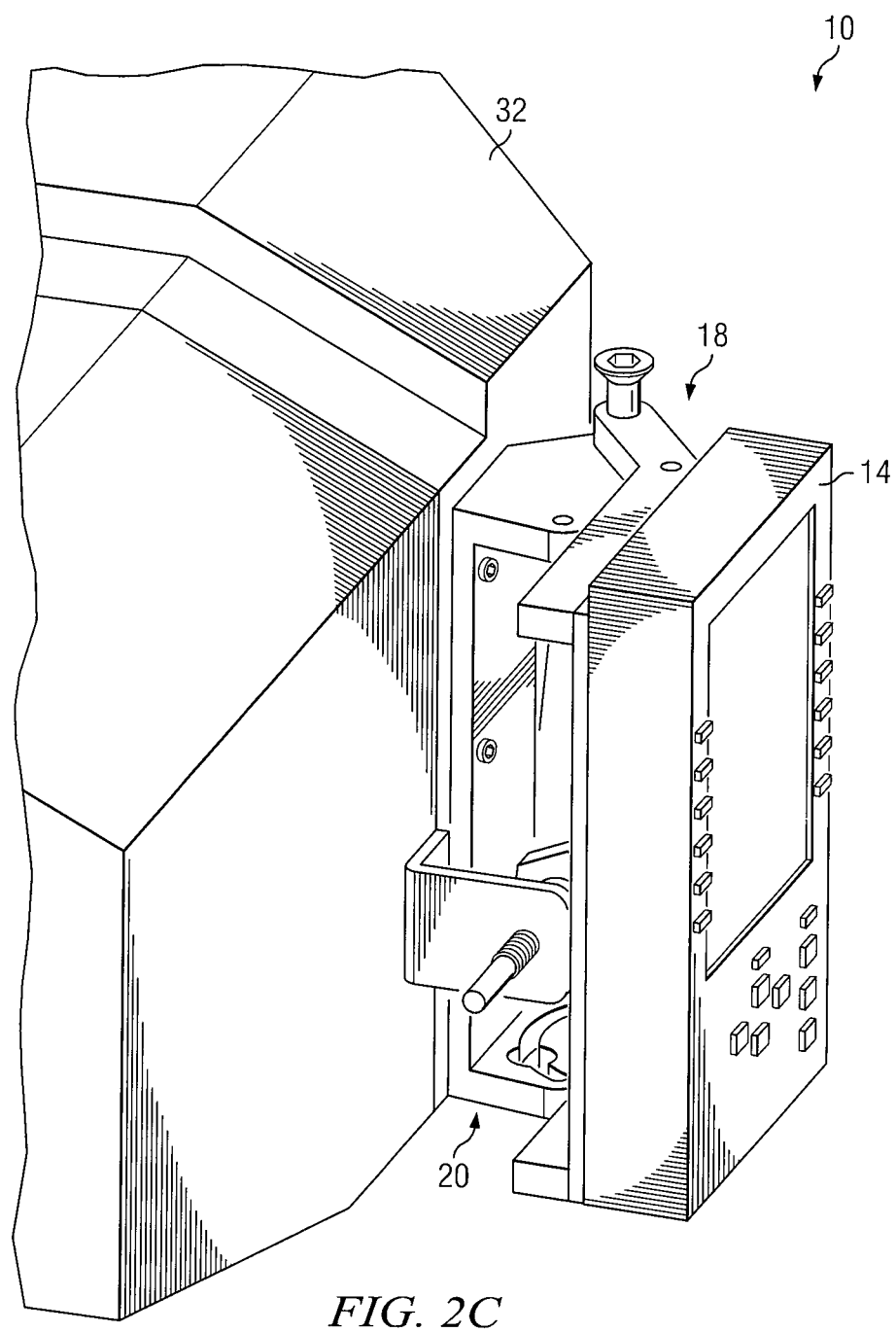

FIGS. 2A, 2B, and 2C are front perspective, enlarged front perspective, and enlarged rear perspective views, respectively, of the electronic flight bag mounting system 10 while in a storage position. Hinge pins 22a (FIGS. 3A and 3B) rotatingly couple electronic flight bag mounting member 18 to cockpit mounting member 20. Thus, hinge pins 22a form an axis from which electronic flight bag 14 may be rotated from a deployed position (FIGS. 1A, 1B, and 1C) to the storage position (FIGS. 2A, 2A, and 2C).

FIGS. 3A and 3B are enlarged front perspective and enlarged rear perspective views of the electronic flight bag mounting system 10 in a removed position in which electronic flight bag mounting member 18 is decoupled or separated from cockpit mounting member 20. Thus, electronic flight bag 14 may be removed from cockpit 12 and used and/or stored in a separate location away from cockpit 12. The process for removing electronic flight bag mounting member 18 from cockpit mounting member 20 will be described in detail below.

Electronic flight bag mounting member 18 includes a pair of arms 36 for coupling to a pair of flange plates 38 configured on cockpit mounting member 20. Pins 22 include a corresponding pair of hinge pins 22a that are coaxially aligned with one another and fixed in the arms 36 of electronic flight bag mounting member 18. The coaxial alignment of hinge pins 22a allow rotation of electronic flight bag mounting member 18 from the deployed position to the storage position. In the particular embodiment shown, hinge pins 22a form an axis that is generally vertical such electronic flight bag 14 may be rotated horizontally from the deployed position to the storage position. In other embodiments, hinge pins 22a may be aligned in any manner, such as in a horizontal or diagonal orientation, such that electronic flight bag 14 may be rotated in any desired direction.

Pins 22 also include a guide pin 22b and a quick release pin 22c. Guide pin 22b rests within a slot 40 configured in one flange plate 38 such that guide pin 22b slides along slot 40 when electronic flight bag mounting member 18 is moved between the deployed position and the storage position. Certain embodiments incorporating guide pin 22b may provide additional stability for electronic flight bag mounting member 18 relative to cockpit mounting member 20 when in the deployed position and/or the storage position.

Securement of electronic flight bag mounting member 18 in the deployed position or the storage position is accomplished by removable insertion of quick release pin 22c through a hole 42 in arm 36 and either of two or more holes 44a or 44b configured in flange plate 38. Thus, movement of electronic flight bag mounting member 18 from the deployed position (FIG. 1A) to the storage position (FIG. 2A) may be accomplished by removing quick release pin 22 from hole 42 and hole 44a, rotating electronic flight bag mounting member 18 towards to the storage position, and then inserting quick release pin 22c into hole 42 and hole 44b. Movement of electronic flight bag mounting member 18 from the storage position to the deployed position may be accomplished by reversing the previously described process.

In the particular embodiment shown hole 44b is provided for holding electronic flight bag mounting member 18 in a single fixed orientation relative to the seat of the cockpit 12. In other embodiments, flange plate 38 may be configured with multiple holes 44b aligned in a radial fashion about hinge pins 22a such that quick release pin 22c may be inserted into any one or multiple holes 44b to maintain electronic flight bag 14 at any one of multiple orientations relative to the seat of cockpit 12 while in the deployed position. Thus, the orientation of electronic flight bag 14 may be adjusted to suit the viewing angle desired by the pilot.

Quick release pin 22c may also facilitate removal of electronic flight bag mounting member 18 from cockpit mounting member 20. Removal of electronic flight bag mounting member 18 may be accomplished by removing quick release pin 22c from hole 42 and either of holes 44a or 44b, and lifting electronic flight bag mounting member 18 relative to cockpit mounting member 20 until hinge pins 22 are free of holes 44a or 44b configured in flange plates 38. Placement of electronic flight bag mounting member 18 back into the deployed position or the storage position may be accomplished by reversing the previously described process.

Implementation of hinge pins 22a, guide pin 22b, and quick release pin 22c describes one particular embodiment moving the electronic flight bag mounting member 18 between the deployed position, the storage position, and the removed position. Other types of hinging mechanisms and/or removable attachment mechanisms may be implemented. The embodiment shown merely describes one particular embodiment that may provide sufficient structural integrity for use in an aircraft that may typically encounter relatively large acceleration forces (G forces) during its normal operation.

Although the present disclosure has been described with several embodiments, a myriad of changes, variations, alterations, transformations, and modifications may be suggested to one skilled in the art, and it is intended that the present disclosure encompass such changes, variations, alterations, transformation, and modifications as they fall within the scope of the appended claims.

What is claimed is:

1. An electronic flight bag mounting system comprising:
    a cockpit mounting member operable to mount to a console configured in the cockpit of an aircraft; and
    an electronic flight bag mounting member operable to mount to an electronic flight bag and releasably coupled to the cockpit mounting member through two or more coaxially-aligned pins of a plurality of pins, the electronic flight bag mounting member rotatable along a vertical axis formed by the two or more coaxially-aligned pins from a deployed position in which the display of the electronic flight bag faces a cockpit seat configured in the cockpit to a storage position in which the electronic flight bag faces away from the cockpit seat;
    wherein the electronic flight bag mounting member is removable from the cockpit mounting member by removal of another one of the plurality of pins from holes in both the cockpit mounting member and the electronic flight bag mounting member; and
    wherein the removal of the another one of the plurality of pins from holes in both the cockpit mounting member and the electronic flight bag mounting member enables rotation of the electronic flight bag mounting member about the vertical axis, relative to the cockpit mounting member.

2. An electronic flight bag mounting system comprising:
    a cockpit mounting member operable to mount to a cockpit of an aircraft;
    an electronic flight bag mounting member coupled to the cockpit mounting member and operable to mount to an electronic flight bag, the electronic flight bag mounting member movable from a deployed position in which the display of the electronic flight bag faces a cockpit seat configured in the cockpit to a storage position in which the electronic flight bag faces away from the cockpit seat; and
    pins that couple the cockpit mounting member to the electronic flight bag mounting member;
    wherein the pins include:
        a pair of coaxially-aligned hinge pins that define an axis about which the electronic flight bag mounting member is rotatable, relative to the cockpit mounting member, from the deployed position to the storage position; and
        a quick release pin that is removable from holes in both the cockpit mounting member and the electronic flight bag mounting member, to enable rotation of the electronic flight bag mounting member, relative to the cockpit mounting member, while the hinge pins still couple the cockpit mounting member to the electronic flight bag mounting member.

3. The electronic flight bag mounting system of claim 2, wherein the electronic flight bag mounting member is separable from the cockpit mounting member by disengagement of the hinge pins from one of the electronic flight bag mounting member or the cockpit mounting member.

4. The electronic flight bag mounting system of claim 2, wherein the deployed position comprises a plurality of angular orientations relative to the cockpit seat such that the electronic flight bag mounting member is adjustable to any one of the plurality of angular orientations.

5. The electronic flight bag mounting system of claim 2, wherein the axis is oriented vertically such that the electronic flight bag is rotated horizontally.

6. The electronic flight bag mounting system of claim 2, wherein the electronic flight bag mounting member comprises a plate having a plurality of holes arranged in a spaced apart pattern corresponding to a bolt pattern of a plurality of female studs configured in the electronic flight bag, the electronic flight bag mounting member mounted to the electronic flight bag using fasteners that extend through the plurality of holes and secured to the plurality of female studs.

7. The electronic flight bag mounting system of claim 2, wherein the cockpit mounting member comprises a plate having a plurality of holes arranged in a spaced apart pattern corresponding to a bolt pattern of a plurality of female studs configured in the cockpit, the cockpit mounting member mounted to the cockpit using fasteners that extend through the plurality of holes and secured to the plurality of female studs.

8. The electronic flight bag mounting system of claim 2, wherein the cockpit mounting member is configured to secure the cockpit mounting member to a console of the cockpit.

9. An apparatus comprising:
    a cockpit mounting member configured to mount to a cockpit of an aircraft;
    an electronic flight bag mounted to an electronic flight bag mounting member, the electronic flight bag mounting member coupled to the cockpit mounting member and movable from a deployed position in which the display of the electronic flight bag faces a cockpit seat configured in the cockpit to a storage position in which the electronic flight bag faces away from the cockpit seat; and
    pins that couple the cockpit mounting member to the electronic flight bag mounting member;
    wherein the pins include:
        a pair of coaxially-aligned hinge pins that define an axis about which the electronic flight bag mounting member is rotatable, relative to the cockpit mounting member, from the deployed position to the storage position; and
        a quick release pin that is removable from holes in both the cockpit mounting member and the electronic flight bag mounting member, to enable rotation of the electronic flight bag mounting member, relative to the cockpit mounting member, while the hinge pins still couple the cockpit mounting member to the electronic flight bag mounting member.

10. The apparatus of claim 9, wherein the electronic flight bag mounting member is separable from the cockpit mounting member by disengagement of the hinge pins from one of the electronic flight bag mounting member or the cockpit mounting member.

11. The apparatus of claim 9, wherein the deployed position comprises a plurality of angular orientations relative to the cockpit seat such that the electronic flight bag mounting member is adjustable to any one of the plurality of angular orientations.

12. The apparatus of claim 9, wherein the axis is oriented vertically such that the electronic flight bag is rotated horizontally.

13. The apparatus of claim 9, wherein the electronic flight bag mounting member comprises a plate having a plurality of holes arranged in a spaced apart pattern corresponding to a bolt pattern of a plurality of female studs configured in the electronic flight bag, the electronic flight bag mounting member mounted to the electronic flight bag using fasteners that extend through the plurality of holes and secured to the plurality of female studs.

14. The apparatus of claim 9, wherein the cockpit mounting member comprises a plate having a plurality of holes arranged in a spaced apart pattern corresponding to a bolt pattern of a plurality of female studs configured in the cockpit, the cockpit mounting member mounted to the cockpit using fasteners that extend through the plurality of holes and secured to the plurality of female studs.

15. The apparatus of claim 9, wherein the cockpit mounting member is configured to secure the cockpit mounting member to a console of the cockpit.

16. An electronic flight bag mounting system comprising:
a cockpit mounting member operable to mount to a cockpit of an aircraft;
an electronic flight bag mounting member coupled to the cockpit mounting member and operable to mount to an electronic flight bag, the electronic flight bag mounting member movable from a deployed position in which the display of the electronic flight bag faces a cockpit seat configured in the cockpit to a storage position in which the electronic flight bag faces away from the cockpit seat; and
one or more pins that couple the cockpit mounting member to the electronic flight bag mounting member;
wherein the cockpit mounting member has an arc-shaped slot therein for slideably receiving one or more pins of the electronic flight bag mounting member and allowing for movement of the one or more pins in the slot during movement of the electronic flight bag mounting member from the deployed position to the storage position.

17. An electronic flight bag mounting system comprising:
a cockpit mounting member operable to mount to a cockpit of an aircraft;
an electronic flight bag mounting member coupled to the cockpit mounting member and operable to mount to an electronic flight bag, the electronic flight bag mounting member movable from a deployed position in which the display of the electronic flight bag faces a cockpit seat configured in the cockpit to a storage position in which the electronic flight bag faces away from the cockpit seat; and
one or more pins that couple the cockpit mounting member to the electronic flight bag mounting member;
wherein the cockpit mounting member has a slot therein for slideably receiving another of the one or more pins of the electronic flight bag mounting member and allowing for circumferential movement of the another of the one or more pins in the slot, the circumferential movement through an arc of a circle having a center defined by one of the one or more pins.

18. The electronic flight bag mounting system of claim 2, further including a plurality of radially aligned holes in the cockpit mounting member, the plurality of radially aligned holes positioned to insertably receive the quick release pin, thereby maintaining the electronic flight bag in any one of a plurality of orientations relative to the cockpit seat.

19. The electronic flight bag mounting system of claim 18, wherein removal of the quick release pin from the plurality of radially aligned holes allows the electronic flight bag to be moved to another of the plurality of orientations relative to the cockpit seat.

20. The electronic flight bag mounting system of claim 2, wherein the pins further include a guide pin that rests within a slot in one of the members to guide the rotation of the electronic flight bag mounting member relative to the cockpit mounting member.

21. The apparatus of claim 9, wherein the pins further include a guide pin that rests within a slot in one of the members to guide the rotation of the electronic flight bag mounting member relative to the cockpit mounting member.

* * * * *